(12) United States Patent
Lin et al.

(10) Patent No.: US 8,711,021 B2
(45) Date of Patent: Apr. 29, 2014

(54) DIGITAL-TO-ANALOG CONVERTER AND PERFORMING METHOD THEREOF

(75) Inventors: Wei-te Lin, Tainan (TW); Tai-haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 13/605,933

(22) Filed: Sep. 6, 2012

(65) Prior Publication Data

US 2013/0063294 A1    Mar. 14, 2013

(30) Foreign Application Priority Data

Sep. 9, 2011    (TW) .............................. 100132605 A (51) Int. Cl.
     *H03M 1/66*      (2006.01)

(52) U.S. Cl.
     USPC .......................................... 341/144; 341/120

(58) Field of Classification Search
     USPC .................. 341/144, 120, 118, 141, 150, 154
     See application file for complete search history.

(56) References Cited

U.S. PATENT DOCUMENTS

| 7,679,539 B2 * | 3/2010 | Lee et al. ....................... 341/144 |
| 2009/0085782 A1 * | 4/2009 | Felder et al. .................. 341/110 |

* cited by examiner

*Primary Examiner* — Joseph Lauture
(74) *Attorney, Agent, or Firm* — Muncy, Geissler, Olds & Lowe, P.C.

(57) ABSTRACT

A digital-to-analog converter and a performing method thereof are disclosed. The digital-to-analog converter includes a random rotation unit, a plurality of conversion units, and a summing unit. The random rotation unit receives a plurality of binary-weighted inputs and generates a plurality of rotated digital outputs according to a random rotation number. The conversion units respectively receive one of the rotated digital outputs and generate a respective analog output. The summing unit sums the respective analog outputs of the conversion units for generating an analog output. The present invention implements the dynamic element matching technique by randomly rotating the binary-weighted inputs, so as to reduce the manufacturing cost of the digital-to-analog converter.

8 Claims, 8 Drawing Sheets

DIGITAL-TO-ANALOG CONVERTER AND PERFORMING METHOD THEREOF

FIELD OF THE INVENTION

The present invention relates to a signal converter, and more particularly to a digital-to-analog converter (DAC) and a performing method thereof.

BACKGROUND OF THE INVENTION

Nowadays, DACs are required for converting digital signals to analog signals in various electronic products, such as communication systems. Current calibration and dynamic element matching (DEM) are the most commonly used for low-cost design. In the Institute of Electrical and Electronics Engineers (IEEE) published papers, the cost of the DEM technique is lower than that of the current calibration technique. Furthermore, the DEM technique may be applied for various technologies because the DEM encoder is implemented with digital circuits. The current calibration technique is limited for certain technologies because some of its building blocks are implemented with analog circuits.

In the DEM technique, inputs are rotated for generating specific outputs. The DEM technique comprises binary-weighted architectures, thermometer-coded architectures and algorithmic controller embedded architectures. The architectures with algorithmic controllers can be used to decrease the switching occurrence. However, the controller embedded architectures have more complicated designs which require more cost when implemented, and can't be operated in high-speed applications. The conventional binary-weighted architectures have advantages of low cost, low complexity, and low power consumption. However, when inputs approach the Nyquist frequency, the switching occurrence is greatly increased, so that glitch problems occur and the linearity is therefore affected. Accordingly, the conventional binary-weighted architectures are seldom used. Compared with the conventional binary-weighted architectures, the thermometer-coded architectures have a lower switching occurrence and can reduce noises. However, the thermometer-coded architectures must comprise additional control circuits, and thus the power consumption and the area cost are higher than those of the conventional binary-weighted architectures. Besides, the operation speed is limited.

Therefore, there is a need to propose a solution having the advantages of the binary-weighted architectures and the thermometer-coded architectures and not having the disadvantages of the binary-weighted architectures and the thermometer-coded architectures.

SUMMARY OF THE INVENTION

An objective of the present invention is to provide a digital-to-analog converter and a performing method thereof.

According to an aspect of the present invention, the digital-to-analog converter comprises a random rotation unit, a plurality of conversion units, and a summing unit. The random rotation unit receives a plurality of binary-weighted inputs and generates a plurality of rotated digital outputs according to a random rotation number. The conversion units respectively receive one of the rotated digital outputs and generate a respective analog output. The summing unit sums the respective analog outputs of the conversion units for generating an analog output.

According to another aspect of the present invention, in the performing method of the digital-to-analog converter, the digital-to-analog converter comprises a random rotation unit, a plurality of conversion units, and a summing unit. The performing method of the digital-to-analog converter comprises: the random rotation unit receives a plurality of binary-weighted inputs and generates a plurality of rotated digital outputs according to a random rotation number; the conversion units respectively receive one of the rotated digital outputs and generate a respective analog output; and the summing unit sums the respective analog outputs of the conversion units to generate an analog output.

The digital-to-analog converter and the performing method thereof according to the present invention implements the dynamic element matching technique by randomly rotating the binary-weighted inputs without extra controlling circuits or encoding circuits. As a result, the manufacturing cost of the digital-to-analog converter can be reduced.

DETAILED DESCRIPTION OF THE PREFERRED EMBODIMENTS

The following descriptions for the respective embodiments are specific embodiments capable of being implemented for illustrations of the present invention with referring to appended figures.

Figure 1:
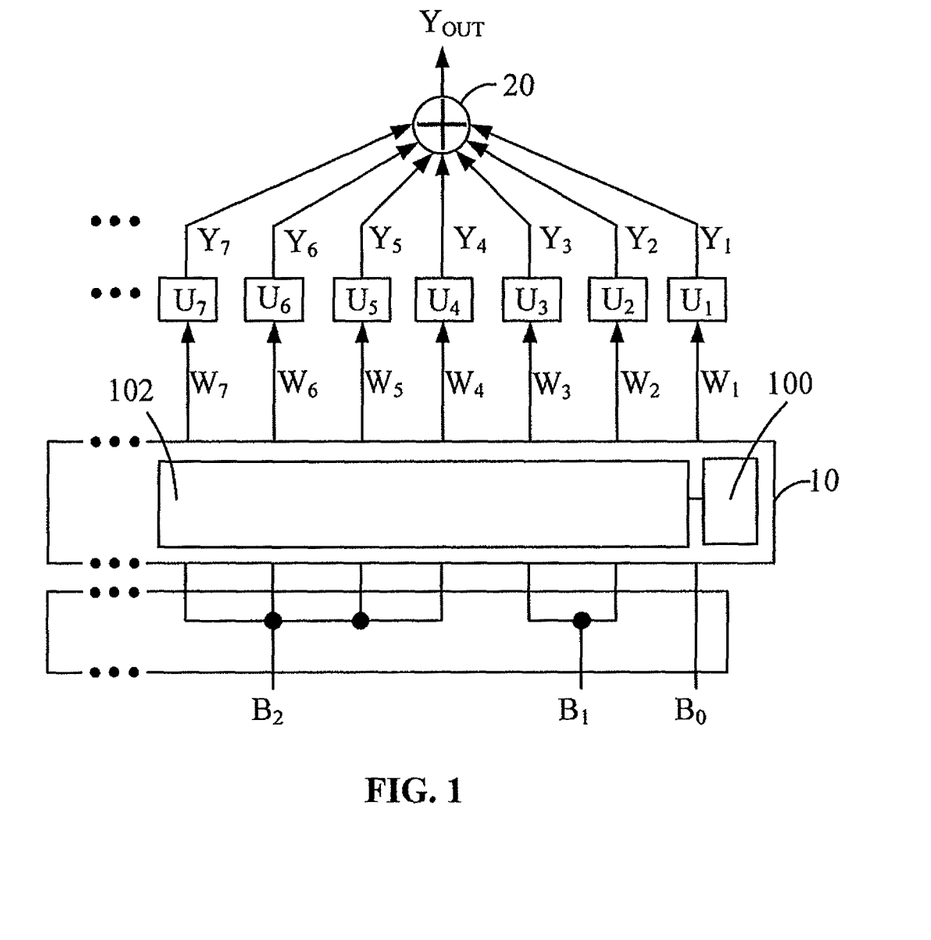
FIG. 1 shows a digital-to-analog converter according to the present invention.

Please refer to FIG. 1. FIG. 1 shows a digital-to-analog converter (DAC) according to the present invention. The DAC comprises a random rotation unit 10, a plurality of conversion units $U_7 \sim U_1$, and a summing unit 20.

The random rotation unit 10 receives a plurality of binary-weighted inputs $B_2 \sim B_0$ and generates a plurality of rotated digital outputs $W_7 \sim W_1$ according to a random rotation number. Specifically, the random rotation unit 10 comprises a pseudo-random number generator (PRNG) 100 and a rotator 102. The pseudo-random number generator 100 is utilized for generating the random rotation number. The rotator 102 shifts and rotates the binary-weighted inputs $B_2 \sim B_0$ according to the random rotation number for generating the rotated digital outputs $W_7 \sim W_1$.

The conversion units $U_7 \sim U_1$ respectively receive one of the rotated digital outputs $W_7 \sim W_1$ and generate one of respective analog outputs $Y_7$~$Y_1$. Each of the conversion units $U_7$~$U_1$ may be a current source, a unit capacitor or other suitable elements.

The summing unit 20 sums the respective analog outputs $Y_7$~$Y_1$ for generating an analog output $Y_{out}$.

Figure 2:
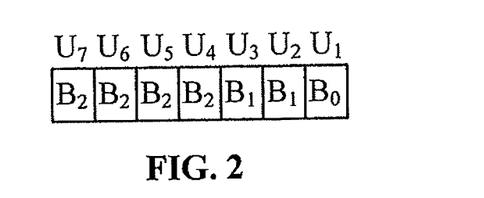
FIG. 2 shows a corresponding relationship between the binary-weighted inputs and the conversion units in the prior arts.
Figure 3:
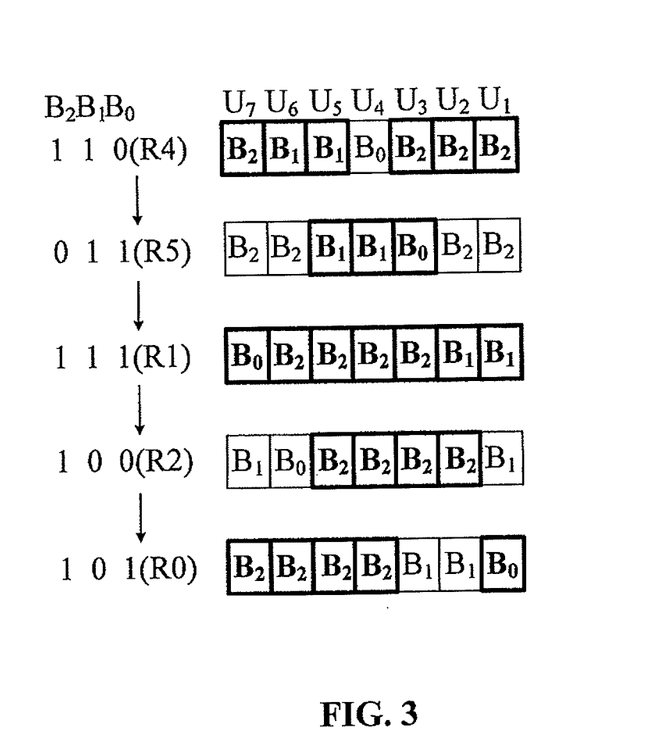
FIG. 3 shows a corresponding relationship between the binary-weighted inputs and the conversion units according to the DAC of the present invention.

The DAC of the present invention implements the dynamic element matching technique by directly receiving the binary-weighted inputs $B_2$~$B_0$ and randomly rotating the binary-weighted inputs $B_2$~$B_0$. The DAC of the present invention may be regarded as a random rotation architecture. Please refer to FIG. 2 and FIG. 3. FIG. 2 shows a corresponding relationship between the binary-weighted inputs $B_2$~$B_0$ and the conversion units $U_7$~$U_1$ in the prior arts. FIG. 3 shows a corresponding relationship between the binary-weighted inputs $B_2$~$B_0$ and the conversion units $U_7$~$B_1$ according to the DAC of the present invention. In the prior arts as shown in FIG. 2, the binary-weighted input $B_2$ controls the four conversion units $U_7$~$U_4$, the binary-weighted input $B_1$ controls the two conversion units $U_3$~$U_2$, and the binary-weighted input $B_0$ controls the conversion unit $U_1$, and so on.

Please refer to FIG. 1 and FIG. 3. When the binary-weighted inputs $B_2$~$B_0$ are "110" (i.e. corresponding to 6 in decimal) and the pseudo-random number generator 100 generates the random rotation number having a right-rotation direction and a rotation (or called shift) of 4-steps. The right-rotation direction and the rotation of 4-steps are represented as R4 in FIG. 3. The rotator 102 shifts and rotates the binary-weighted inputs $B_2$~$B_0$ in FIG. 2 for generating the rotated, digital outputs $W_7$~$W_1$ in FIG. 1. It is noted that FIG. 3 does not show the rotated digital outputs $W_7$~$W_1$ in FIG. 1, FIG. 3 shows the corresponding relationship between the binary-weighted inputs $B_2$~$B_0$ and the conversion units $U_7$~$U_1$. After performing the right-rotation of 4-steps, the binary-weighted input $B_2$ controls the conversion units $U_7$, $U_3$, $U_2$, $U_1$, the binary-weighted input $B_1$ controls the conversion units $U_6$, $U_5$, and the binary-weighted input $B_0$ controls the conversion unit $U_4$. The binary-weighted inputs $B_2$~$B_0$ in FIG. 2 and the binary-weighted inputs $B_2$~$B_0$ in FIG. 3 control different conversion units $U_7$~$U_1$. When the binary-weighted input $B_2$ is "1", it means that the conversion units $U_7$, $U_3$, $U_2$, $U_1$ controlled by the binary-weighted input $B_2$ are selected. When the binary-weighted input $B_1$ is "1", it means that the conversion units $U_6$, $U_5$ controlled by the binary-weighted input $B_1$ are selected. As a result, the output is a sum of all selected conversion units, that is, the analog output $Y_{out}=Y_7+Y_6+Y_5+Y_3+Y_2+Y_1$.

Then, when the binary-weighted inputs $B_2$~$B_0$ are changed from "110" to "011" (i.e. corresponding to 3 in decimal) and the pseudo-random number generator 100 generates the random rotation number having the right-rotation direction and a rotation of 5-steps. The right-rotation of 5-steps is represented as R5 in FIG. 3. After the rotator 102 shifts and rotates the binary-weighted inputs $B_2$~$B_0$ in FIG. 2 by the right-rotation of 5-steps, the binary-weighted input $B_2$ controls the conversion units $U_7$, $U_6$, $U_2$, $U_1$, the binary-weighted input $B_1$ controls the conversion units $U_5$, $U_4$, and the binary-weighted input $B_0$ controls the conversion unit $U_3$. When the binary-weighted input $B_1$ is "1", it means that the conversion units $U_5$, $U_4$ controlled by the binary-weighted input $B_1$ are selected. When the binary weighted input $B_0$ is "1", it means that the conversion unit $U_3$ controlled by the binary-weighted input $B_0$ is selected. As a result, the output is a sum of all selected conversion units, that is, the analog output $Y_{out}=Y_5+Y_4+Y_3$.

When the binary-weighted inputs $B_2$~$B_0$ are changed from "011" to "111" (i.e. corresponding to 7 in decimal) and the pseudo-random number generator 100 generates the random rotation number having the right-rotation of 1-step. The right-rotation of 1-step is represented as R1 in FIG. 3. After the rotator 102 shifts and rotates the binary-weighted inputs $B_2$~$B_0$ in FIG. 2 by the right-rotation of 1-step, the binary-weighted input $B_2$ controls the conversion units $U_6$, $U_5$, $U_4$, $U_3$, the binary-weighted input $B_1$ controls the conversion units $U_2$, $U_1$, and the binary-weighted input $B_0$ controls the conversion unit $U_7$. When the binary-weighted input $B_2$ is "1", it means that the conversion units $U_6$, $U_5$, $U_4$, $U_3$ controlled by the binary-weighted input $B_2$ are selected. When the binary-weighted input $B_1$ is "1", it means that the conversion units $U_2$, $U_1$ controlled by the binary-weighted input $B_1$ are selected. When the binary-weighted input $B_0$ is "1", it means that the conversion unit $U_7$ controlled by the binary-weighted input $B_0$ is selected. As a result, the output is a sum of all selected conversion units, that is, the analog output $Y_{out}=Y_7+Y_6+Y_5+Y_4+Y_3+Y_2\pm Y_1$.

When the binary-weighted inputs $B_2$~$B_0$ are changed from "111" to "100" (i.e. corresponding to 4 in decimal) and the pseudo-random number generator 100 generates the random rotation number having the right-rotation of 2-steps. The right-rotation of 2-steps is represented as R2 in FIG. 3. After the rotator 102 shifts and rotates the binary-weighted inputs $B_2$~$B_0$ in FIG. 2 by the right-rotation of 2-steps, the binary-weighted input $B_2$ controls the conversion units $U_5$, $U_4$, $U_3$, $U_2$, the binary-weighted input $B_1$ controls the conversion units $U_7$, $U_1$, and the binary-weighted input $B_0$ controls the conversion unit $U_6$. When the binary-weighted input $B_2$ is "1", it means that the conversion units $U_5$, $U_4$, $U_3$, $U_2$ controlled by the binary-weighted input $B_2$ are selected. The output is a sum of all selected conversion units, that is, the analog output $Y_{out}Y_5\pm Y_4+Y_3+Y_2$.

Finally, when the binary-weighted inputs $B_2$~$B_0$ are changed from "100" to "101" (i.e. corresponding to 5 in decimal) and the pseudo-random number generator 100 generates the random rotation number having the right-rotation of 0-step. The right-rotation of 0-step is represented as R0 in FIG. 3. Since the rotator 102 does not perform any rotation on the binary-weighted inputs $B_2$~$B_0$ in FIG. 2, the binary-weighted input $B_2$ controls the conversion units $U_7$, $U_6$, $U_5$, $U_4$, the binary-weighted input $B_1$ controls the conversion units $U_3$, $U_2$, and the binary-weighted input $B_0$ controls the conversion unit $U_1$. When the binary-weighted input $B_2$ is "1", it means that the conversion units $U_7$, $U_6$, $U_5$, $U_4$ controlled by the binary-weighted input $B_2$ are selected. When the binary-weighted input $B_0$ is "1", it means that the conversion unit $U_1$ controlled by the binary-weighted input $B_0$ is selected. The output is a sum of all selected conversion units, that is, the analog output $Y_{out}=Y_7+Y_6+Y_5+Y_4+Y_1$.

It is noted that FIG. 3 shows the examples of the right-rotation direction. In another embodiment, the rotation direction may be a left-rotation direction or be determined randomly.

Figure 4:
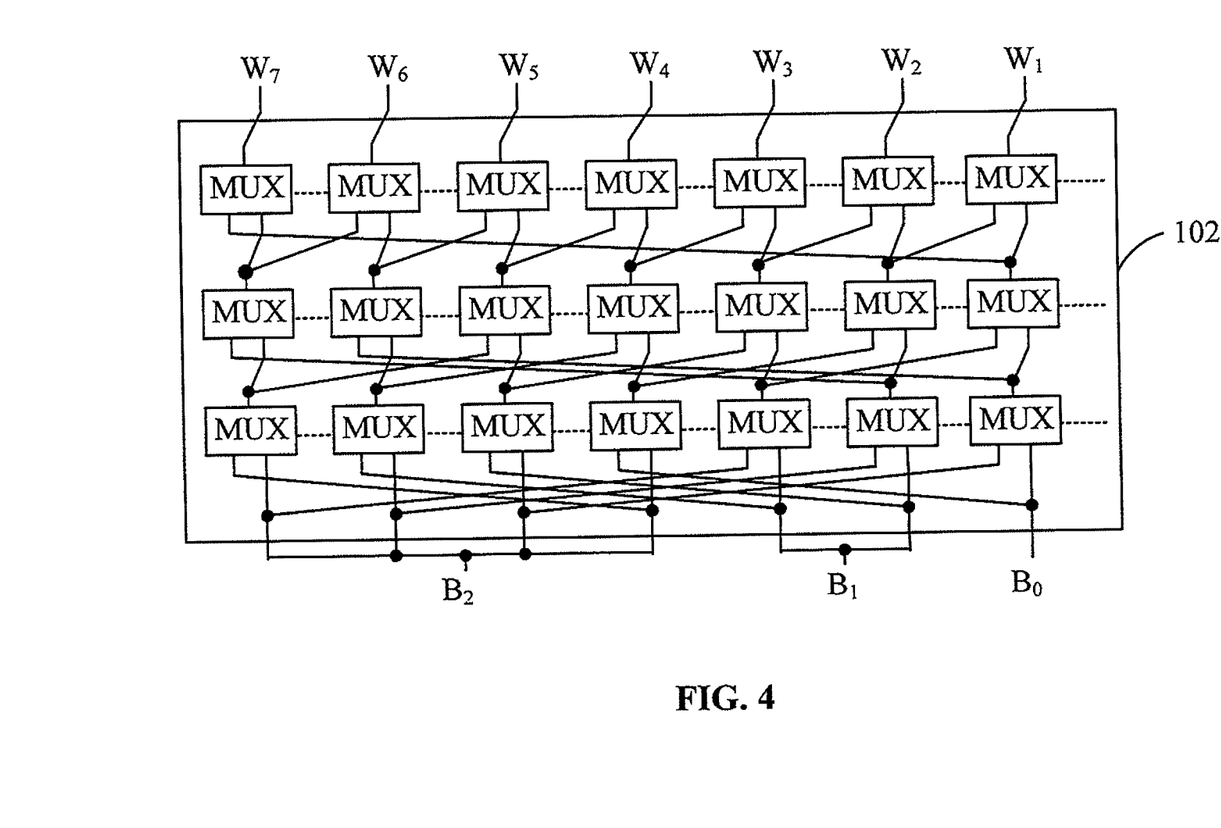
FIG. 4 shows an embodiment of the rotator in FIG. 1.

Please refer to FIG. 4. FIG. 4 shows an embodiment of the rotator 102 in FIG. 1. The rotator 102 comprises a plurality of multiplexers MUX. The principles of the multiplexers MUX are known for one skilled in the art of the present invention and thus omitted herein. Furthermore, the rotator 102 is not limited to the implementation in FIG. 4, and it may be other implementations.

Figure 5:
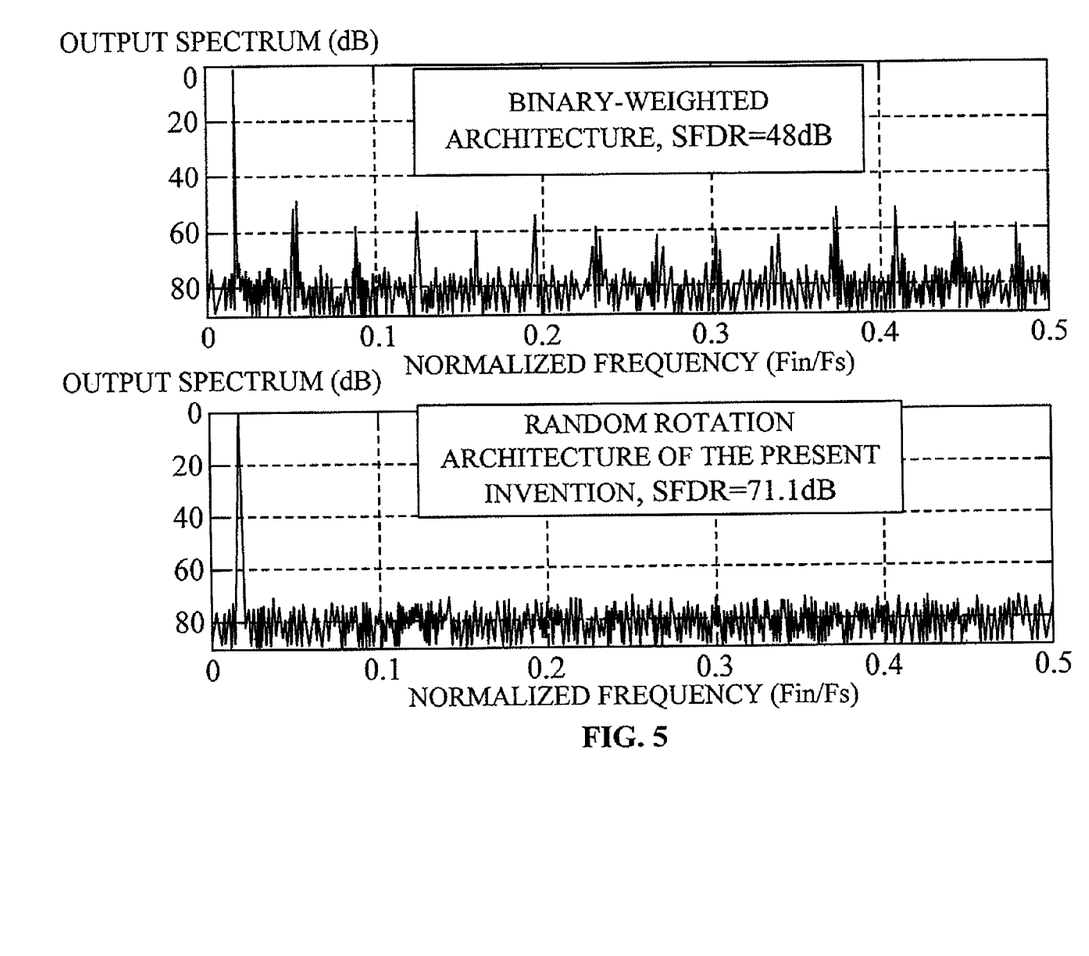
FIG. 5 shows spurious-free dynamic ranges of the DAC having 10% mismatch error according to the present invention and the conventional binary-weighted architecture.

Please refer to FIG. 5. FIG. 5 shows spurious-free dynamic ranges (SFDR) of the DAC having 10% mismatch error according to the present invention and the conventional binary-weighted architecture. The DAC according to the present invention and the conventional binary-weighted architecture are implemented with 6 bits. It can be seen from the comparison that the SFDR of the DAC according to the present invention is better than the SFDR of the conventional binary-weighted architecture by 23.1 dB (71.1 dB−48 dB=23.1 dB).

Figure 6:
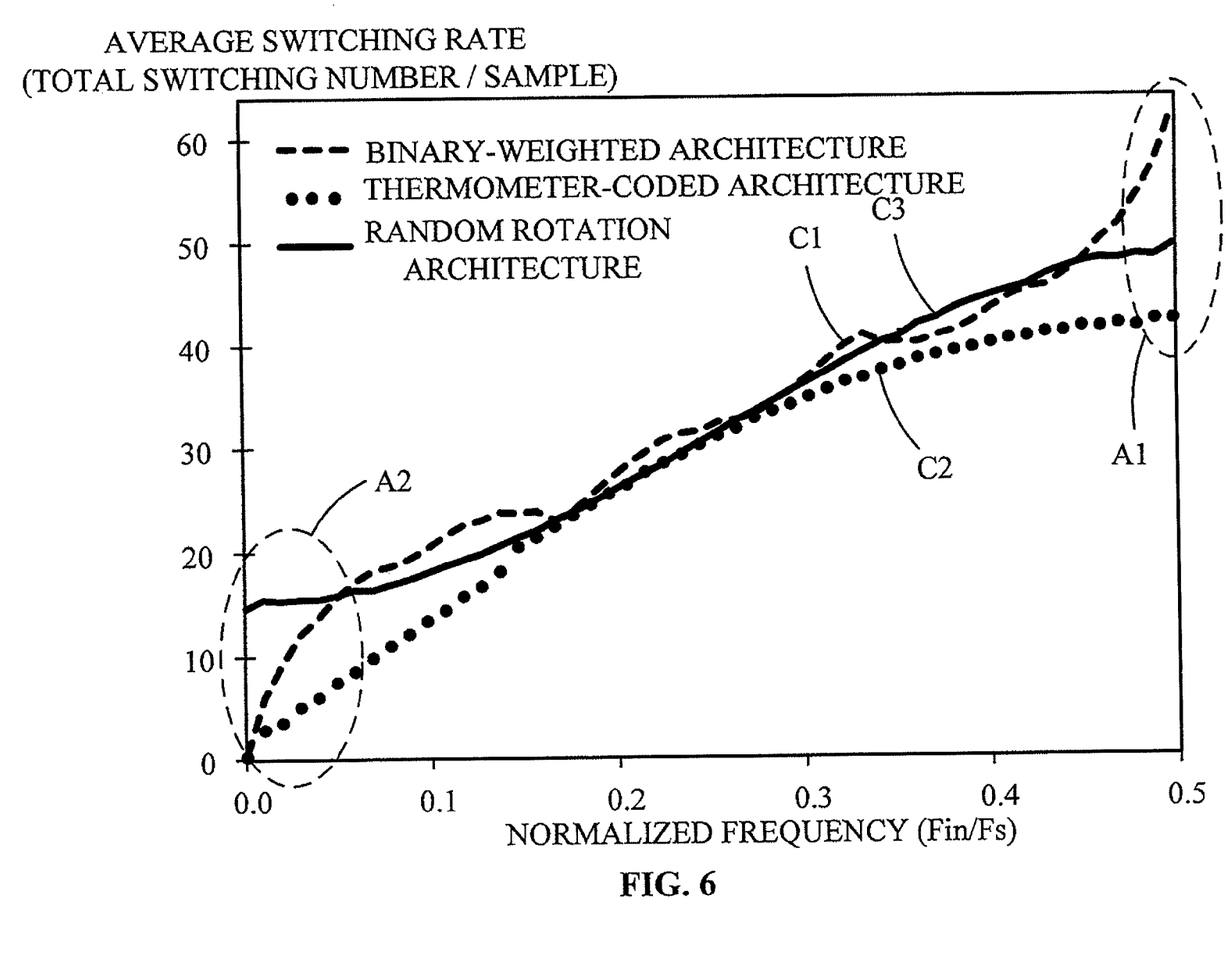
FIG. 6 shows curves of average switching rates of the conventional binary-weighted architecture, the conventional thermometer-coded architecture, and the random rotation architecture of the present invention.

Please refer to FIG. 6. FIG. 6 shows curves of average switching rates of the conventional binary-weighted architecture, the conventional thermometer-coded architecture, and the random rotation architecture of the present invention. Y-axis is the average switching rate. The definition of the average switching rate is a total switching number per sample. X-axis is a normalized frequency. The definition of the normalized frequency is a value of an input frequency divided by a sample frequency (Fin/Fs). Curves C1, C2, C3 respectively represent the conventional binary-weighted architecture, the conventional thermometer-coded architecture, and the random rotation architecture of the present invention. In the same normalized frequency, the smaller average switching rate is better. The smaller average switching rate means that the switching occurrence is fewer. The switching number refers to a number of turn-on and turn-off of the conversion units $U_7$~$U_1$.

In a high frequency band, i.e. in the area A1 (about the Nyquist frequency), the average switching rate of the curve C2 is smallest. It means that the conventional thermometer-coded architecture has the best performance. However, extra controlling circuits or encoding circuits are required in the conventional thermometer-coded architecture, so that the required layout area is largest, and the cost and power consumption are highest, too. Accordingly, the conventional thermometer-coded architecture is not suitable in high speed portable applications, such as communication systems. Compared with the switching occurrence of the conventional binary-weighted architecture, the switching occurrence of the random rotation architecture of the present invention (curve C3) in the area A1 can be decreased by about 20%. As a result, a glitch problem of the conventional binary-weighted architecture due to the large switching occurrence in the high frequency band can be solved.

In a low frequency band, i.e. in the area A2, the average switching rate of the curve C2 is smallest. It means that the conventional thermometer-coded architecture has the best performance. However, the cost is the highest as mentioned above. Although the performance of the random rotation architecture of the present invention (curve C3) in the area A2 is worse than the performance of the conventional thermometer-coded architecture, the switching occurrence is usually not large in the low frequency band. Accordingly, the effect to low frequency band is limited. In addition, for the purpose of increasing the performance in the low frequency band, the frequency of generating the random rotation number from pseudo-random number generator 100 may be decreased for decreasing the switching occurrence in the low frequency band. Preferredly, the frequency is decreased to ½, ¼, . . . , and so on. The frequency may be set as required.

In summary, the random rotation architecture of the present invention is capable of solving the glitch problem in the high frequency band (i.e. in the area A1) in the conventional binary-weighted architecture. Although the performance of the random rotation architecture of the present invention is worse than the conventional thermometer-coded architecture, the present invention does not required extra controlling circuits or encoding circuits. As a result, the manufacturing (area) cost of the DAC, including digital controlling circuits, analog current switches, and conversion units, can be decreased by more than 80%. The effect of performance degradation of the present invention in the low frequency band (i.e. the area A2) is limited. The random rotation architecture of the present invention is capable of increasing the performance in the low frequency band by decreasing the frequency of generating the random rotation number from the pseudo-random number generator 100.

Figure 7:
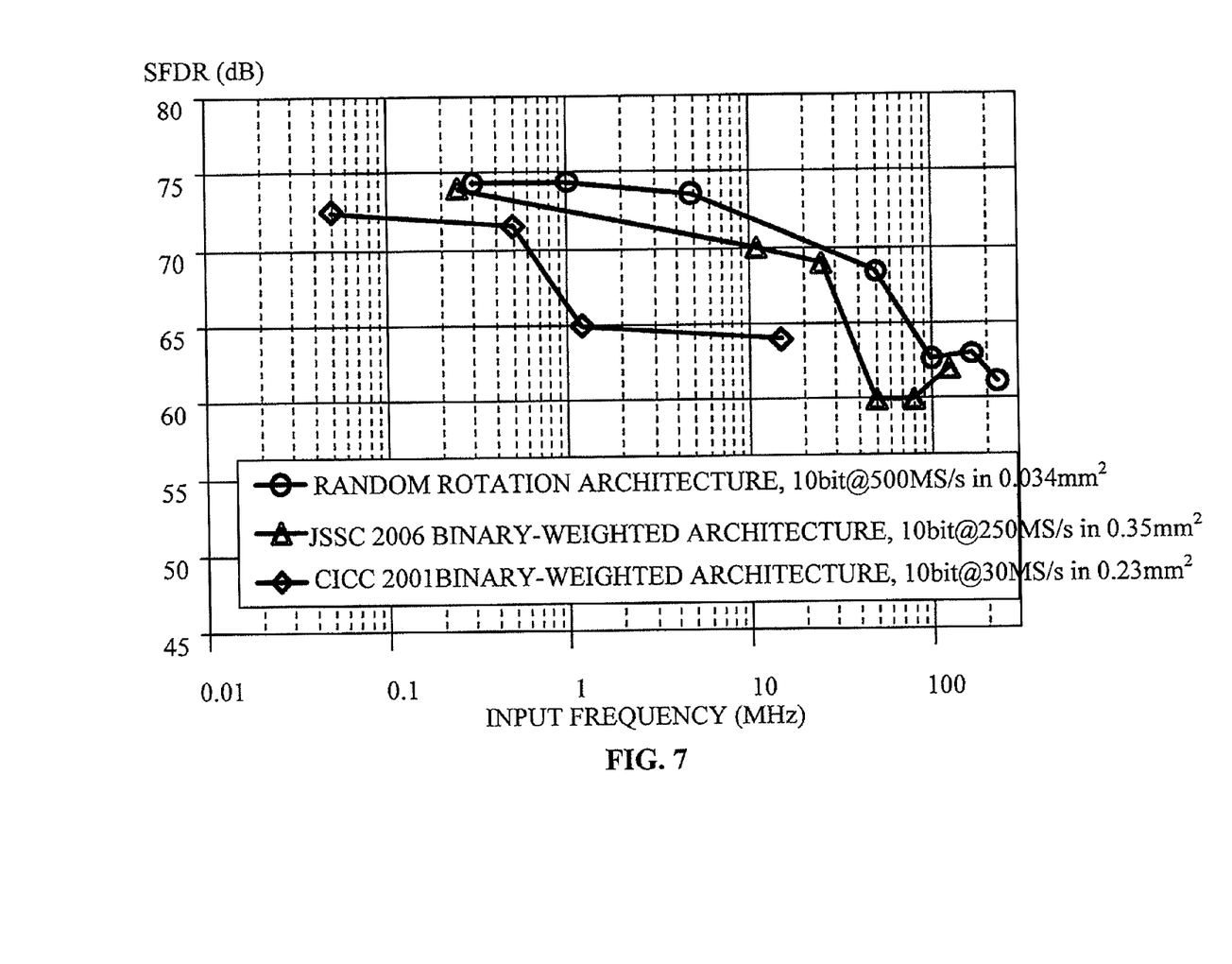
FIG. 7 shows the SFDRs of the random rotation architecture of the present invention, the conventional binary-weighted architecture in JSSC 2006, and the conventional binary-weighted architecture in CICC 2001.

Please refer to FIG. 7. FIG. 7 shows the SFDRs of the random rotation architecture of the present invention, the conventional binary-weighted architecture in Journal of Solid-State Circuits (JSSC) 2006, and the conventional binary-weighted architecture in Custom Integrated Circuits Conference (CICC) 2001. It can be seen that the SFDR of the random rotation architecture of the present invention is better than the SFDRs of the two other architectures. Besides, the implementation area is the smallest.

The following TABLE 1 shows comparison of the DAC of the random rotation architecture of the present invention, the conventional binary-weighted architecture or the conventional thermometer-coded architecture in International Solid-State Circuit conference (ISSCC) 2011, Transactions on Circuits and Systems I (TCASI) 2010, JSSC 2009, JSSC2006, and JSSC 2001.

TABLE 1

|  | present invention | ISSCC 2011 | TCASI 2010 | JSSC 2009 | JSSC 2006 | JSSC 2001 |
| --- | --- | --- | --- | --- | --- | --- |
| Resolution (bit) | 10 | 12 | 10 | 12 | 10 | 10 |
| Technology | 0.18 μm | 90 nm | 0.13 μm | 65 nm | 0.18 μm | 0.35 μm |
| Sample rate (MS/s) | 500 | 1250 | 1600 | 2900 | 250 | 1000 |
| $I_{load}$ (mA) | 10 | 16 | 10 | 50 | 10 | 20 |
| $P_{total}$ (mW) | 24 | 128 | 23.6 | 188 | 22 | 110 |
| $BW_N$ (MHz) | 250 | 500 | 325 | 100 | 125 | 500 |
| Area (mm²) | 0.034 | 0.825 | 0.5 | 0.31 | 0.35 | 0.35 |
| $SFDR_{DC}$ (dB) | 74 | 75 | 74 | 74 | 74 | 74 |
| $SFDR_{Nyquist}$ (dB) | 61 | 66 | 50 | N/A | 60 | 61 |
| FOM1 | 1.07E+04 | 1.60E+04 | 1.23E+04 | 2.18E+03 | 5.82E+03 | 4.65E+03 |
| FOM2 | 8.25E+07 | 7.50E+07 | 3.29E+07 | N/A | 4.02E+07 | 3.52E+07 |
| FOM3 | 3.14E+05 | 1.94E+04 | 2.46E+04 | 7.03E+03 | 1.66E+04 | 1.33E+04 |

In TABLE 1, the area refers to an active area of the DAC. $BW_N$ refers to a bandwidth for remaining the SFDR of (6×bit) dB. $SFDR_{DC}$ refers to a best SFDR measured in the Nyquist frequency. $SFDR_{Nyquist}$ refers to a worst SFDR measured in the Nyquist frequency. FOM1~FOM3 refer to figures of merit commonly used in IEEE and define as follows:

$$FOM1 = \frac{2^N \times BW_N}{P_{total}}$$

$$FOM2 = \frac{2^{\frac{SFDR_{DC}-1.76}{6.02}} \times 2^{\frac{SFDR_{Nyquist}-1.76}{6.02}} \times f_{clk}}{P_{total} - \frac{1}{2} I_{load}^2 \times R_{load}}$$

$$FOM3 = \frac{2^N \times BW_N}{P_{total} \times \text{Area}}$$

It is noted that higher values of the above-mentioned FOM1~FOM3 have better results. In comparison with the conventional binary-weighted architecture or the conventional thermometer-coded architecture, the FOM2 and FOM3 of the present invention are better and the FOM1 of the present invention is not bad. As a result, the present invention can implement a high speed DAC with a low area cost.

Figure 8:
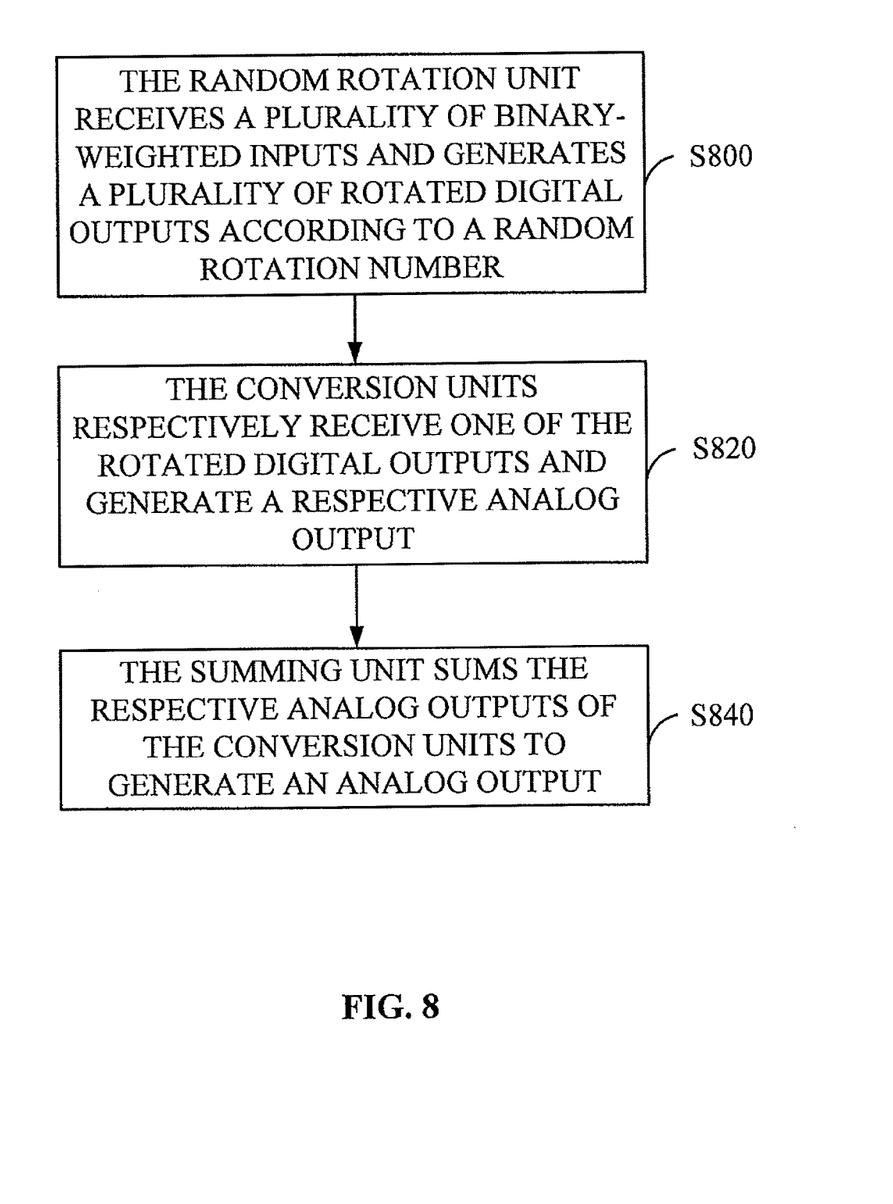
FIG. 8 shows a flow chart of a performing method of a digital-to-analog converter according to the present invention.

Please refer to FIG. 8. FIG. 8 shows a flow chart of a performing method of a digital-to-analog converter according to the present invention. The digital-to-analog converter comprises a random rotation unit, a plurality of conversion units, and a summing unit. Firstly, in step S800, the random rotation unit receives a plurality of binary-weighted inputs and generates a plurality of rotated digital outputs according to a random rotation number. Each of the conversion units is a current source or a unit capacitor. The random rotation number has a rotation direction and a rotation step. The rotation direction may be a left-rotation direction, a right-rotation direction, or be determined randomly. The rotation refers to a step of the rotation.

In step S820, the conversion units respectively receive one of the rotated digital outputs and generate a respective analog output.

In step S840, the summing unit sums the respective analog outputs of the conversion units to generate an analog output.

Figure 9:
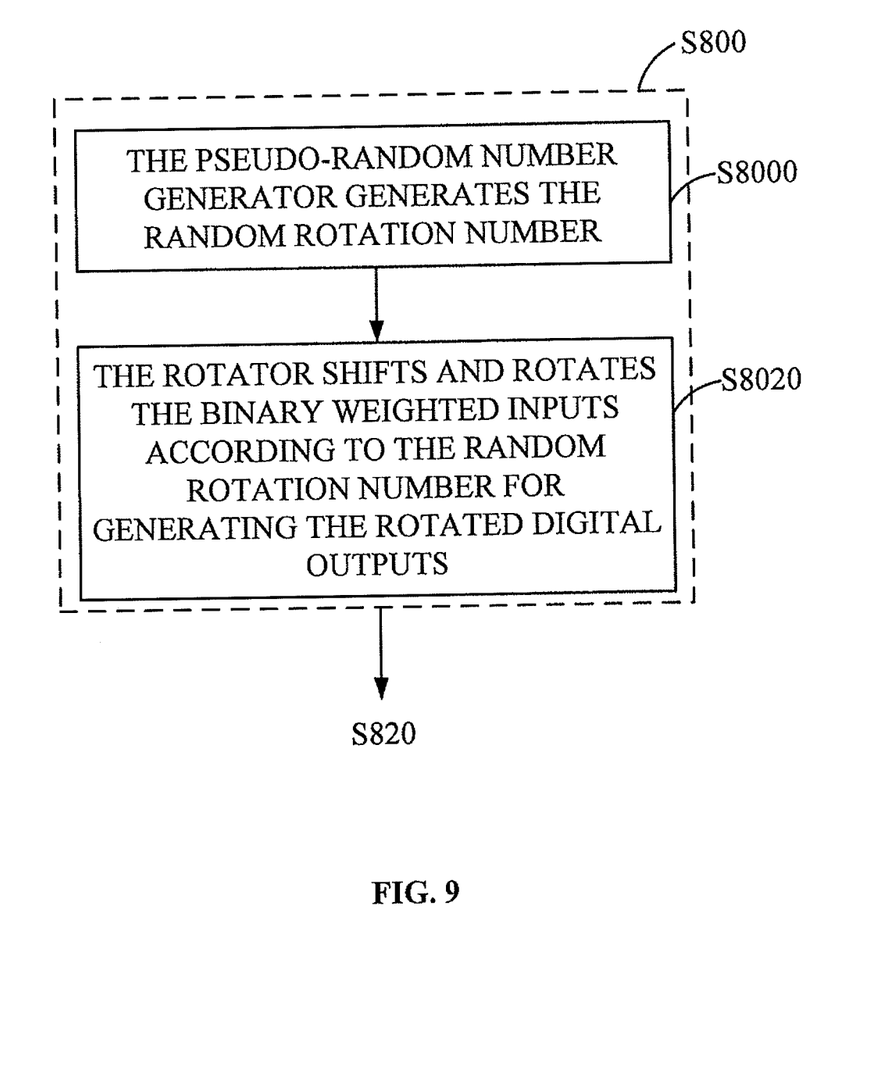
FIG. 9 shows detailed steps in step S800 in FIG. 8.

In one embodiment, the random rotation unit comprises a pseudo-random number generator and a rotator. Step S800 comprises steps shown in FIG. 9. In step S8000, the pseudo-random number generator generates the random rotation number. In step S8020, the rotator shifts and rotates the binary-weighted inputs according to the random rotation number for generating the rotated digital outputs. Furthermore, the frequency of generating the random rotation number may be decreased for decreasing the switching occurrence in the low frequency band. Preferrediy, the frequency is decreased to ½, ¼, . . . , and so on. The frequency may be set as required.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A digital-to-analog converter, comprising:
    a random rotation unit, receiving a plurality of binary-weighted inputs and generating a plurality of rotated digital outputs according to a random rotation number, the random rotation unit comprising:
        a pseudo-random number generator, generating the random rotation number; and
        a rotator, shifting and rotating the binary-weighted inputs according to the random rotation number for generating the rotated digital outputs;
    a plurality of conversion units, respectively receiving one of the rotated digital outputs and generating a respective analog output; and
    a summing unit, summing the respective analog outputs of the conversion units for generating an analog output,
    wherein a frequency of generating the random rotation number from the pseudo-random number generator is reduced for decreasing a switching occurrence of the digital-to-analog converter in a low frequency band.

2. The digital-to-analog converter of claim 1, wherein each of the conversion units is a current source or a unit capacitor.

3. The digital-to-analog converter of claim 1, wherein the random rotation number has a rotation direction and a rotation step.

4. The digital-to-analog converter of claim 3, wherein the rotation direction is a left-rotation direction, a right-rotation direction, or determined randomly.

5. A performing method of a digital-to-analog converter, the digital-to-analog converter comprising a random rotation unit, a plurality of conversion units, and a summing unit, the random rotation unit comprising a pseudorandom number generator and a rotator, the performing method of the digital-to-analog converter comprising:
    the random rotation unit receiving a plurality of binary-weighted inputs and generating a plurality of rotated digital outputs according to a random rotation number;
    the conversion units respectively receiving one of the rotated digital outputs and generating a respective analog output; and
    the summing unit summing the respective analog outputs of the conversion units to generate an analog output,
    wherein the step of receiving the binary-weighted inputs and generating the rotated digital outputs according to the random rotation number comprises:
    the pseudo-random number generator generating the random rotation number; and
    the rotator shifting and rotating the binary-weighted inputs according to the random rotation number for generating the rotated digital outputs,
    wherein a frequency of generating the random rotation number from the pseudo-random number generator is reduced for decreasing a switching occurrence of the digital-to-analog converter in a low frequency band.

6. The performing method of the digital-to-analog converter of claim 5, wherein each of the conversion units is a current source or a unit capacitor.

7. The performing method of the digital-to-analog converter of claim 5, wherein the random rotation number has a rotation direction and a rotation step.

8. The performing method of the digital-to-analog converter of claim 7, wherein the rotation direction is a left-rotation direction, a right-rotation direction, or determined randomly.

* * * * *